United States Patent
Gudi et al.

(10) Patent No.: US 9,363,119 B1
(45) Date of Patent: Jun. 7, 2016

(54) FSK DECODING USING ENVELOPE COMPARISON IN THE DIGITAL DOMAIN

(71) Applicant: Honeywell International Inc., Morristown, NJ (US)

(72) Inventors: Balakrishna G. Gudi, Karnataka (IN); Dinesh Kumar Kn, Karnataka (IN); Aravind Sathyanarayana, Karnataka (IN); Sandeep Pai, Karnataka (IN)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 14/812,827

(22) Filed: Jul. 29, 2015

(51) Int. Cl.
*H04L 27/14* (2006.01)
*H04B 1/10* (2006.01)

(52) U.S. Cl.
CPC . *H04L 27/14* (2013.01); *H04B 1/10* (2013.01)

(58) Field of Classification Search
CPC ......... H04L 27/14; H04L 27/156; H04B 1/10
USPC ........................................................ 375/334
See application file for complete search history.

(56) References Cited

U.S. PATENT DOCUMENTS

| 5,260,974 A | * | 11/1993 | Johnson | H04B 1/1027 329/353 |
| 5,365,516 A | * | 11/1994 | Jandrell | G01S 5/0009 340/991 |
| 6,996,218 B2 | | 2/2006 | Chen | |
| 2006/0256908 A1 | * | 11/2006 | Ludwig | H03D 13/004 375/375 |

* cited by examiner

*Primary Examiner* — Michael Neff
(74) *Attorney, Agent, or Firm* — Jeffer & Associates, P.A.

(57) ABSTRACT

A method of FSK decoding includes generating a pulse waveform (R'Edge) from a received FSK encoded signal (FSK signal) and a system clock (Sys_clk). From R'Edge and Sys_clk clocks are generated including a first clock and second clock framing a logic '0' level of the FSK signal, and a third clock and fourth clock framing a logic '1' level of the FSK signal. At least four frequency envelopes are generated from the clocks including a logic '0' envelope, a logic '1' envelope, a lower frequency envelope below the logic '0' envelope, and an upper frequency envelope above the logic '1' envelope. R'Edge is compared to the four envelopes, and a decoded output is produced, logic '0' if the R'Edge overlaps the logic '0' envelope, logic '1' if R'Edge overlaps the logic '1' envelope, and a previous output state if R'Edge does not overlap the logic '0' or logic '1' envelope.

15 Claims, 2 Drawing Sheets

FSK DECODING USING ENVELOPE COMPARISON IN THE DIGITAL DOMAIN

FIELD

Disclosed embodiments relate to Frequency-shift keying (FSK) decoding.

BACKGROUND

FSK is a frequency modulation method in which digital information is transmitted through discrete frequency changes of a carrier wave. The simplest FSK method is binary FSK (BFSK). BFSK uses a pair of discrete frequencies to transmit binary (0s and 1s) information. With this method, the "1" is generally called the mark frequency and the "0" is generally called the space frequency.

There are a variety of known techniques known for FSK decoding an FSK encoded signal. Most commonly used FSK/tone decoding techniques uses phase lock loops (PLLs) or dedicated tone decoders in the analog domain, window comparison in VHSIC Hardware Description Language (VHDL) in the digital domain, or digital logic based simple decoders for low frequency applications.

FSK decoding is generally relatively easy when the respective frequencies are widely spaced apart (e.g., (Highway Addressable Remote Transducer Protocol (HART) 1,200 Hz (8.3 ms)-2,200 Hz (4.5 ms) and the baud rate is low. But when the respective frequencies are closely placed and when the baud rate is high, FSK decoder design becomes complex especially for communication applications where noise margins are higher on received signals.

There are dedicated tone decoder devices generally available which can generally decode FSK modulated signals with above mentioned constraints. However, these dedicated tone decoder devices add to the cost and complexity of the design, including tuning to specific frequencies, sensitive to aging of components, temperature dependent variations. These dedicated tone decoder devices are generic in nature and specific requirements on frequency variance and the lock-in time for tones typically cannot be altered/customized beyond a certain level.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include Frequency-shift keying (FSK) decoding using envelope comparison in the digital domain that provides a cost-effective method for rapid and precise decoding for FSK-based communication channels. Such embodiments address the need for a precision but cost-effective FSK decoding method in the digital domain, and offer reliable performance for FSK communication applications for difficult (e.g., noisy) environments, such as is generally present in process solutions (e.g. Industrial plants).

Disclosed embodiments include a method of FSK decoding that includes generating a pulse waveform (R'Edge) from a received FSK encoded signal (FSK signal) and a system clock (Sys_clk), and generating a plurality of clocks from R'Edge and Sys_clk including a first clock and second clock framing a frequency for a logic '0' level of the FSK signal and a third clock and fourth clock framing a frequency for a logic '1' level of the FSK signal. At least four frequency envelopes are generated from the plurality of clocks including a logic '0' envelope, a logic '1' envelope, a lower frequency envelope below the logic '0' envelope, and an upper frequency envelope above the logic '1' envelope. R'Edge is compared to the four envelopes, and an decoded output is produced being logic '0' if the R'Edge overlaps the logic '0' envelope, logic '1' if R'Edge overlaps the logic '1' envelope, and a previous output state if R'Edge does not overlap the logic '0' or logic '1' envelope.

DETAILED DESCRIPTION

Figure 1:
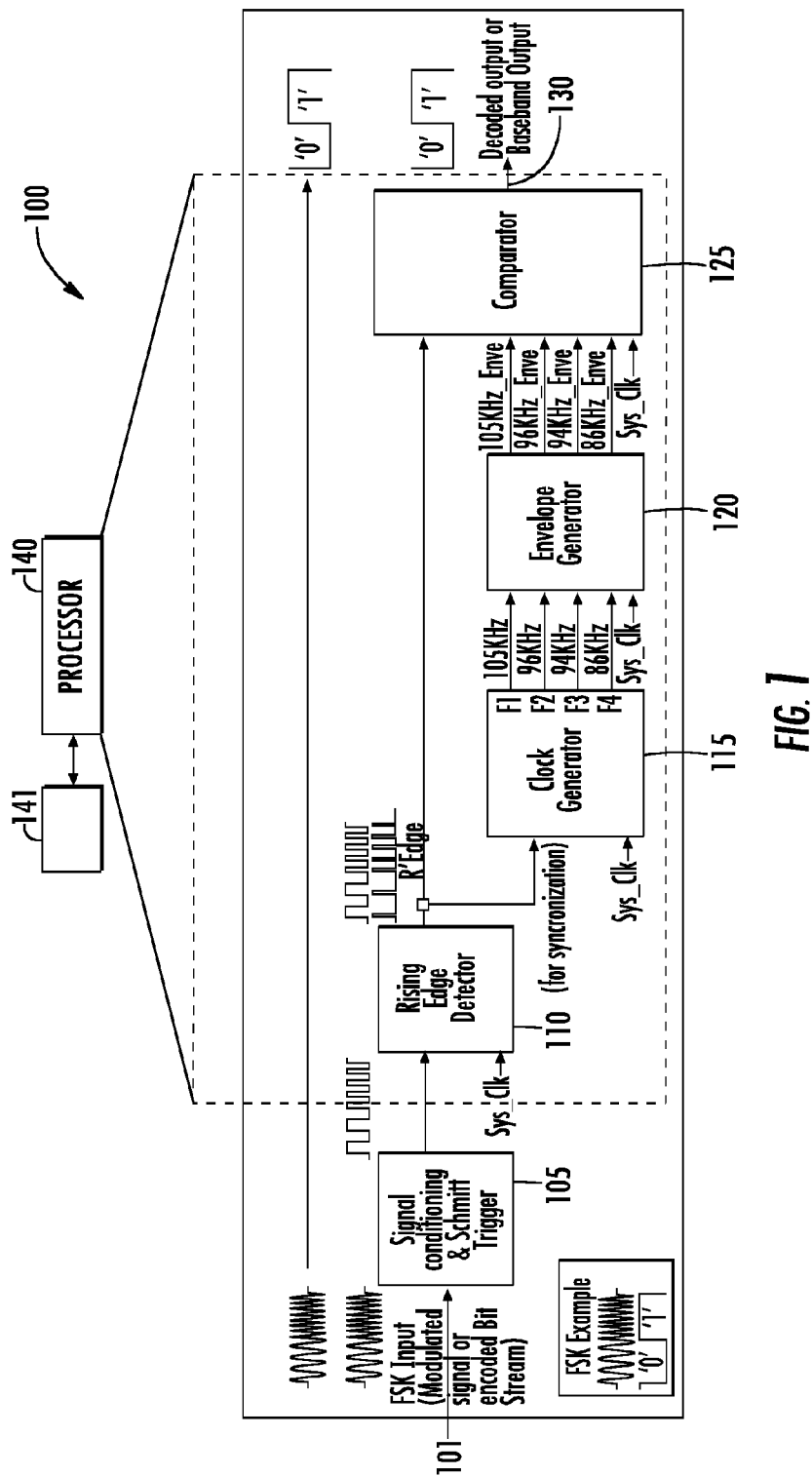
FIG. 1 is a block diagram for an example FSK decoder using envelope comparison in the digital domain, according to an example embodiment.

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments include FSK decoding using envelope comparison in the digital domain which provides cost effective and precision decoding of FSK signals that is particularly suitable for a FSK-based communication channels which run on higher baud rates (e.g., a standard baud rate such as 1,200, 2,400, 4,800 to any possible upper limit that a particular design supports or any custom baud rate value). Disclosed envelope comparison is applied to an incoming (received) FSK signal using a plurality of frequency ranges including a lower frequency range for a logic '0' bit level and a higher frequency range for a logic '1' bit level.

FIG. 1 is a block diagram for an example FSK decoder 100 using envelope comparison in the digital domain, according to an example embodiment. A Schmitt trigger and signal conditioning block (wave shaper 105) can be used to provide front end signal conditioning and signal shaping of the received FSK modulated signal (FSK signal) 101. The signal conditioner of the wave shaper 105 converts any odd shaped signals to a non-negative square wave in digital domain (>0V) for easier processing while the Schmitt trigger of the wave shaper 105 helps avoid unwanted noise into the FSK decoder 100.

The wave shaper 105 outputs a shaped (pulsating) waveform that is coupled to an input of a rising edge detector block (RED 110). An example known edge detection circuit can comprise a D (delay) flip flop and an inverter, where the inverter is connected between the Q output of the D flip flop and its asynchronous clear input (CLR). As the inverter's output is connected to the CLR of the flip flop, a short impulse on the Q output is generated as the incoming FSK signal 101 is received by the data input of the D flip flop goes high.

Figure 2:
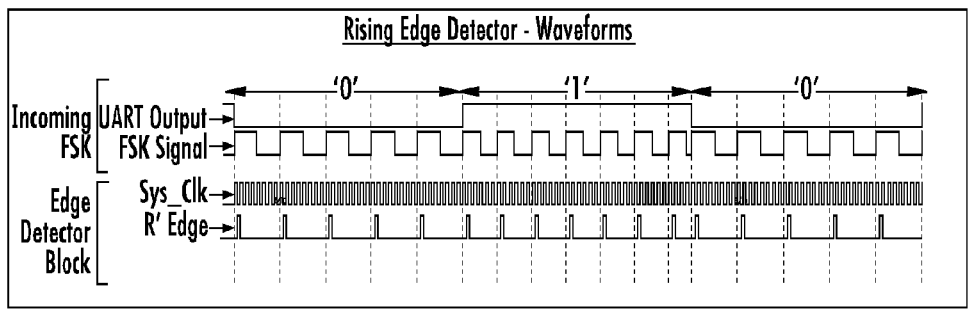
FIG. 2 depicts example rising edge detector (RED) waveforms including the received shaped FSK signal from the wave shaper, as well as the Sys_clock, and its R'Edge pulse output.

RED 110 outputs a pulse shown as R'Edge having a pulse width of one system clock (Sys_clk) at every "Rising Edge" of the incoming FSK signal 101. FIG. 2 depicts example RED 110 waveforms including the received shaped FSK signal from the wave shaper 105, as well as the Sys_clock, and the R'Edge pulse output.

The carrier frequency for the FSK signal 101 is shown only for example to be about 95 kHz +/−a 1 kHz dead band frequency and is changed for a logic '0' level to 90 kHz and changed for a logic '1' level to 100 kHz. Based on this example design, about a +/−5% of variation is used on the carrier frequency. Other frequency levels and variation %'s can be used. With these two resulting frequencies (90 kHz and 100 kHz) from the carrier frequency at least four different clocks are generated which define frequency limits that will be used for comparison as described below. The R'Edge pulse signal output from RED 110 is input to a clock generator block (clock generator 115) along with Sys_clk. In response the clock generator 115 generates four different clocks shown as two above the carrier frequency at 104 kHz, 96 kHz, and two below the carrier frequency 94 kHz and 86 kHz. The R'Edge pulse output by the RED 110 that is input to the clock generator 115 functions to synchronize all four clocks with the incoming FSK signal 101.

Figure 3:
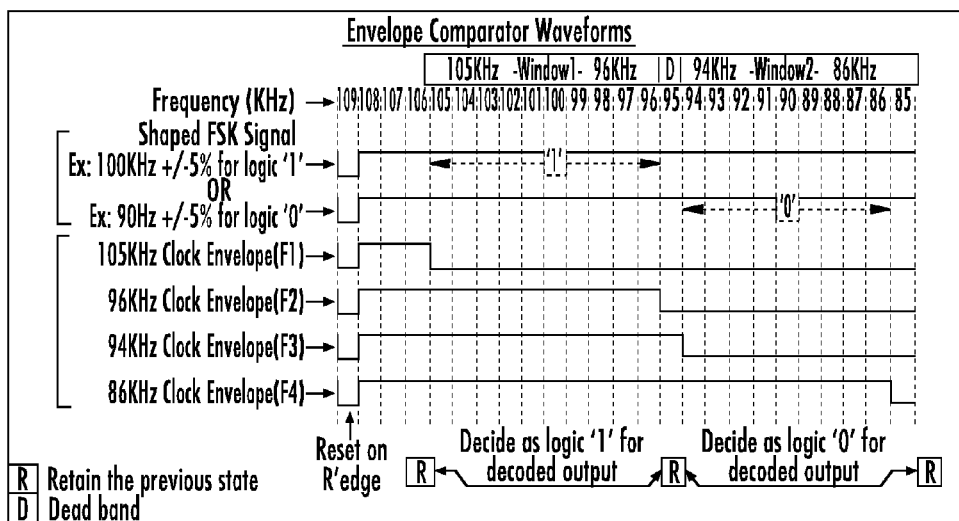
FIG. 3 shows example envelope comparator waveforms, according to an example embodiment.

These four clock outputs are fed to an envelope generator block (EG 120). The EG 120 can generally comprise any circuit that generates logic "1" from one rising edge of an input signal to another rising edge of the same input signal, basically depicting the total cycle period of incoming signal frequency. EG 120 generates four frequency envelopes equivalent to four input frequencies. The four outputs provided by EG 120 are shown fed to a comparator block (comparator) 125 along with the R'Edge pulse for frequency comparison to the R'Edge signal. FIG. 3 shows example envelope comparator waveforms.

The comparator 125 operates with respect to the Sys_clk. Comparator 125 compares the overlap of the R'edge pulse provided by RED 110 with the four envelopes provided by EG 120 and provides a decoded (or baseband) output 130. Based on overlap of incoming FSK reflected in the R'edge pulse within the frequency range bound by frequencies defining a logic '0' and a logic '1', a logic "0" or "1" is generated at the decoded output 130 of the comparator 125 as shown in FIG. 3. In the case there is no overlap, then the decoded output 130 follows previous state. That is, in this example if the R'Edge pulse frequency output by the RED 110 is:

<86 kHz then decoded output 130 is the previous state;
<94 kHz—>86 kHz, then decoded output 130 is a logic '0';
<105 kHz—>96 kHz, then decoded output 130 is a logic '1'.
>105 kHz then decoded output 130 is the previous state, and
between 94 kHz and 96 kHz then decoded output 130 is the previous state.

Disclosed FSK decoders such as FSK decoder 100 provide flexibility at all levels due to design in digital domain in terms modularizing of blocks, combining or separation of logical blocks, ease of debug, and also to display internal state machine status as well all the parameters. The parameters generally can be realized in form of digital domain parallel read/write registers, for example frequency settings, tolerance settings, frequency window selection, error handling, error measurement) of the FSK decoder are generally programmable (e.g., using programmable registers present (Hardware) using Software). An advantage of this disclosed approach is that, the decision of comparator 125 reflected in the bit provided by the decoded output 130 is correctable at every pulse level. Additional filtering to avoid spurious toggling of the decoded output 130 bits due to noise can be performed done at bit level. Due to the disclosed digital domain approach, the comparator 125 can reject signals with acceptable frequency but being spurious in nature. That is acceptable/correct frequency at reception by the comparator 125 generally has to be consistent for more sample than just one sample, otherwise the decoded output 130 will remain old (previous) state rather than changing to new state due to a spurious signal frequency.

Disclosed FSK decoding can be implemented in hardware, or a suitable combination of hardware and software. For example, disclosed FSK decoding can be realized using a Field Programmable Gate Array (FPGA)/configurable logic blocks (CPLDs), or as shown in FIG. 1 with the RED 110, clock generator 115, envelope generator 120 and comparator 125 all comprising digital circuitry implemented by a processor 140 (e.g., microcontroller, microprocessor or digital signal processor (DSP)) having an associated memory 141 storing disclosed FSK decoding code.

As used herein and by way of example and not by limitation, "hardware" can include a combination of discrete components, an integrated circuit, an application-specific integrated circuit, a field programmable gate array, a general purpose processing or server platform, or other suitable hardware. As used herein and by way of example and not by limitation, "software" can include one or more objects, agents, threads, lines of code, subroutines, separate software applications, one or more lines of code or other suitable software structures operating in one or more software applications or on one or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

One commonly used FSK signal is binary FSK that is described being used above. However, disclosed FSK decoding can also be extended to all other FSK techniques such as multiple frequency-shift keying (MFSK). MFSK is a variation of FSK that uses more than two frequencies. For MFSK, unlike FSK there will be more than 4 reference frequencies used to generate more than four envelopes. The combination of envelopes will be used to determine a logical pattern. For example, Binary bit 00=F1, 01=F2, 10=F3, 11=F4. F1 will have a window of frequency from F1minus to F1plus and similarly F2 will have a window of frequency from F2minus to F2plus. Similarly for F3, and F4. There will be total of 8 envelopes from these reference frequencies generated to be used at the comparator stage for making decision.

Advantages of disclosed FSK decoding includes the entire decoding can be all performed in digital domain without the need for phase lock loops (PLLs) or dedicated tone decoders. Precision decoding can be performed to reduce packet error rate at communication channels. High scalability of channel count (e.g. 1 to 6 channels) can be provided without adding significantly to cost because implementation in digital domain is relatively easy with a VHSIC Hardware Description Language (VHDL) coding technique as it allows easy instantiation of proven logic blocks. Cost of logic cells used to realize logic devices utilized as described herein is substantially less expensive now as technology to produce a complex and high density Field Programmable Gate Array (FPGA) or Complex Programmable Logic Device (CPLD) has significantly improved. Adjustable frequency tolerance can be used, Due to programmability this is relatively easy in the digital domain to suit legacy/aged devices in the field as well as to tune during product validation and production.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure, including decoding of other encoded bit streams besides FSK encoded bit streams. In addition, while a particular feature may have been disclosed with respect to only one of several implementations, such feature may be combined with one or more other features of the other implementations as may be desired and advantageous for any given or particular application.

As will be appreciated by one skilled in the art, the subject matter disclosed herein may be embodied as a system, method or computer program product. Accordingly, this Disclosure can take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, this Disclosure may take the form of a computer program product embodied in any tangible medium of expression having computer usable program code embodied in the medium.

We claim:

1. A method of frequency-shift keying (FSK) decoding, comprising:
    generating a pulse waveform (R'Edge) from a received FSK encoded signal (FSK signal) and a system clock (Sys_clk);
    generating a plurality of clocks from said R'Edge and said Sys_clk including a first clock and second clock framing a frequency for a logic '0' level of said FSK signal, and a third clock and fourth clock framing a frequency for a logic '1' level of said FSK signal;
    generating at least four frequency envelopes from said plurality of clocks including a logic '0' envelope, a logic '1' envelope, a lower frequency envelope below said logic '0' envelope, and an upper frequency envelope above said logic '1' envelope;
    comparing said R'Edge to said four frequency envelopes, and
    outputting a decoded output of said logic '0' if said R'Edge overlaps said logic '0' envelope, said logic '1' if said R'Edge overlaps said logic '1' envelope, and a previous output state if said R'Edge does not overlap said logic '0' envelope or overlap said logic '1' envelope.

2. The method of claim 1, further comprising signal conditioning and signal shaping said FSK signal before said generating said R'Edge.

3. The method of claim 2, wherein a Schmitt trigger is used for said signal shaping including removing of noise.

4. The method of claim 1, wherein said FSK signal is a binary FSK signal.

5. The method of claim 1, wherein said FSK signal is a multiple frequency-shift keying (MFSK) signal.

6. The method of claim 1, wherein all steps in said method are performed in a digital domain.

7. The method of claim 6, wherein said method is realized by a processor having associated memory.

8. The method of claim 1, wherein said first clock and said second clock are at frequencies below a carrier frequency of said FSK signal, and wherein said third clock and said fourth clock are at frequencies above said carrier frequency of said FSK signal.

9. A frequency-shift keying (FSK) decoder, comprising:
    a rising edge detector (RED) for generating a pulse waveform (R'Edge) from a received FSK encoded signal (FSK signal) and a system clock (Sys_clk);
    a clock generator for generating a plurality of clocks from said R'Edge and said Sys_clk including a first clock and second clock framing a frequency for a logic '0' level of said FSK signal and a third clock and fourth clock framing a frequency for a logic '1' level of said FSK signal;
    an envelope generator for generating at least four frequency envelopes from said plurality of clocks including a logic '0' envelope, a logic '1' envelope, a lower frequency envelope below said logic '0' envelope, and an upper frequency envelope above said logic '1' envelope, and
    a comparator for comparing said R'Edge to said four frequency envelopes and providing a decoded output, said decoded output being said logic '0' if said R'Edge overlaps said logic '0' envelope, said logic '1' if said R'Edge overlaps said logic '1' envelope, and a previous output state if said R'Edge does not overlap said logic '0' envelope or overlap said logic '1' envelope.

10. The FSK decoder of claim 9, further comprising a Schmitt trigger and signal conditioning block (wave shaper) for signal conditioning and signal shaping said FSK signal before said generating said R'Edge.

11. The FSK decoder of claim 9, wherein said RED, said clock generator, said envelope generator and said comparator all comprise digital circuitry implemented by a processor having associated memory.

12. The FSK decoder of claim 9, wherein said RED outputs said R'Edge having a pulse width of said Sys_clk at every rising edge of said FSK signal.

13. The FSK decoder of claim 9, wherein said Sys_clk is further coupled to an input of said envelope generator and to an input of said comparator.

14. The FSK decoder of claim 9, wherein said FSK signal is a multiple frequency-shift keying (MFSK) signal and wherein said envelope generator is for generating 8 of said frequency envelopes from said plurality of clocks.

15. The FSK decoder of claim 9, wherein said first clock and said second clock are at frequencies below a carrier frequency of said FSK signal, and wherein said third clock and said fourth clock are at frequencies above said carrier frequency of said FSK signal.

* * * * *